US009686862B2

United States Patent
Daghighian

(10) Patent No.: US 9,686,862 B2
(45) Date of Patent: Jun. 20, 2017

(54) CAPACITORS FOR MULTILAYER PRINTED CIRCUIT BOARDS

(71) Applicant: FINISAR CORPORATION, Sunnyvale, CA (US)

(72) Inventor: Henry Meyer Daghighian, Redwood City, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/858,759

(22) Filed: Sep. 18, 2015

(65) Prior Publication Data

US 2016/0088731 A1 Mar. 24, 2016

Related U.S. Application Data

(60) Provisional application No. 62/053,878, filed on Sep. 23, 2014.

(51) Int. Cl.
*H01G 4/06* (2006.01)
*H05K 1/11* (2006.01)
(Continued)

(52) U.S. Cl.
CPC .......... *H05K 1/115* (2013.01); *H05K 1/0231* (2013.01); *H05K 1/0298* (2013.01); *H05K 1/092* (2013.01); *H05K 1/113* (2013.01); *H05K 1/162* (2013.01); *H05K 1/182* (2013.01); *H05K 1/0243* (2013.01); *H05K 2201/0187* (2013.01); *H05K 2201/0257* (2013.01); *H05K 2201/09545* (2013.01); *H05K 2201/09809* (2013.01); *H05K 2201/10734* (2013.01)

(58) Field of Classification Search
CPC .......... H05K 2201/09545; H05K 2201/09581; H05K 2201/09809; H05K 1/113; H05K 1/115; H05K 1/162; H05K 1/182; H05K 2201/0959; H01G 4/06; H01G 4/08; H01G 4/10; H01G 4/122; H01G 4/206; H01G 4/1227
See application file for complete search history.

(56) References Cited

U.S. PATENT DOCUMENTS 4,613,560 A * 9/1986 Dueber ................. G03F 7/0047
257/E21.534
5,566,046 A * 10/1996 Kulwicki ............. H01G 4/1227
361/321.5

(Continued)

FOREIGN PATENT DOCUMENTS

WO 2008059322 A2 5/2008

OTHER PUBLICATIONS

International Search Report Written Opinion of the International Searching Authority dated Dec. 1, 2015 as received in Application No. PCT/US2015/051758 (15 Pages)/.

*Primary Examiner* — Chau N Nguyen
*Assistant Examiner* — Roshn Varghese
(74) *Attorney, Agent, or Firm* — Maschoff Brennan

(57) ABSTRACT

A capacitor in a multilayer printed circuit board is described. The capacitor may include a via of a via-in-pad type and a dielectric mixture filled in the via of the via-in-pad type. The via may be disposed under an integrated circuit contact pad of the multilayer printed circuit board. The dielectric mixture may include a nanoparticle-sized dielectric powder mixed with an adhesive material.

20 Claims, 5 Drawing Sheets

(51) Int. Cl.
*H05K 1/09* (2006.01)
*H05K 1/02* (2006.01)
*H05K 1/18* (2006.01)
*H05K 1/16* (2006.01)

(56) References Cited

U.S. PATENT DOCUMENTS

| | | | |
|---|---|---|---|
| 5,940,966 A * | 8/1999 | Fasano | H01R 12/57 |
| | | | 29/828 |
| 6,544,651 B2 * | 4/2003 | Wong | C08K 3/24 |
| | | | 257/E23.077 |
| 7,025,607 B1 | 4/2006 | Das et al. | |
| 7,540,082 B2 * | 6/2009 | Ohsumi | H05K 3/0094 |
| | | | 174/255 |
| 8,107,254 B2 * | 1/2012 | Bandholz | H05K 1/162 |
| | | | 174/261 |
| 2002/0017399 A1 | 2/2002 | Chang et al. | |
| 2003/0173676 A1 * | 9/2003 | Horikawa | H01L 23/49816 |
| | | | 257/758 |
| 2003/0175411 A1 | 9/2003 | Kodas et al. | |
| 2004/0121266 A1 | 6/2004 | Lee et al. | |
| 2005/0126818 A1 * | 6/2005 | Kojima | H05K 3/4602 |
| | | | 174/255 |
| 2008/0289865 A1 * | 11/2008 | Nakamura | H05K 1/162 |
| | | | 174/260 |
| 2009/0095511 A1 * | 4/2009 | Iida | H05K 3/38 |
| | | | 174/255 |
| 2009/0159322 A1 * | 6/2009 | Wu | H01G 9/012 |
| | | | 174/260 |
| 2009/0215605 A1 * | 8/2009 | Letz | C03B 32/02 |
| | | | 501/5 |
| 2010/0084163 A1 * | 4/2010 | Kodani | H01L 21/4846 |
| | | | 174/250 |
| 2014/0146499 A1 | 5/2014 | Jang et al. | |

* cited by examiner

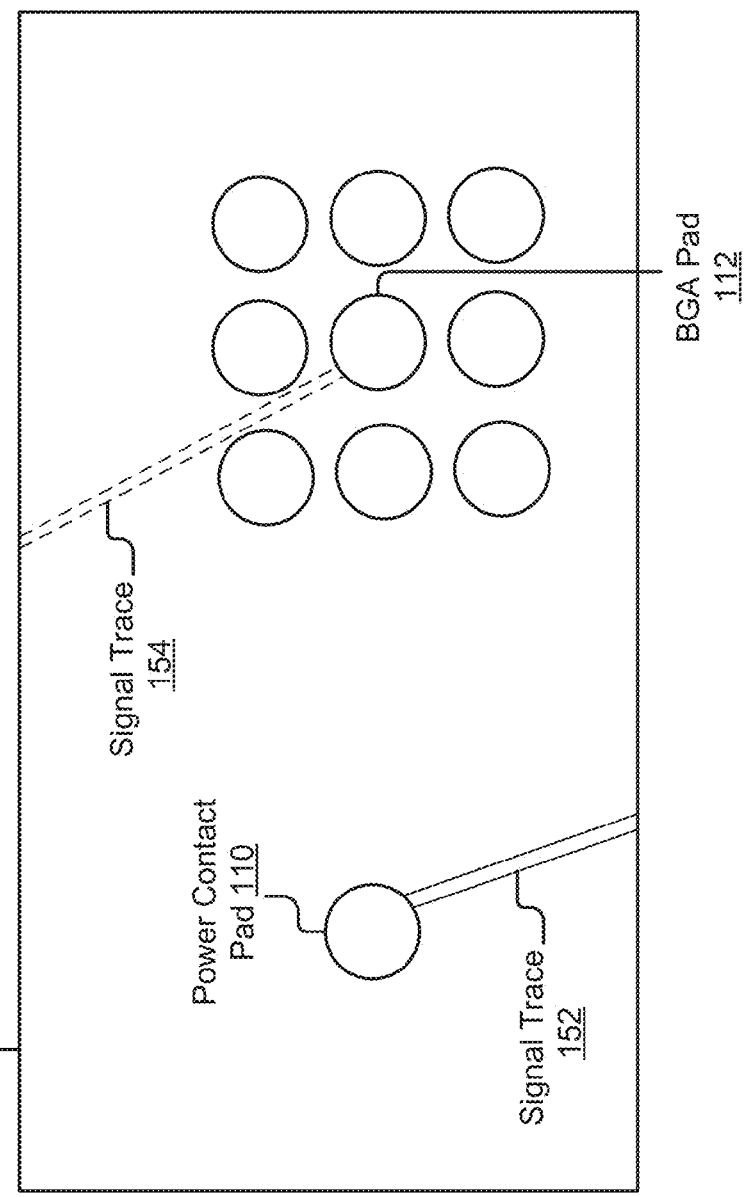

CAPACITORS FOR MULTILAYER PRINTED CIRCUIT BOARDS

CROSS-REFERENCE TO RELATED APPLICATIONS

This application claims the benefit of and priority to U.S. Provisional Patent Application No. 62/053,878, filed on Sep. 23, 2014, which is incorporated herein by reference.

FIELD

Some embodiments described herein generally relate to capacitors for high frequency applications.

BACKGROUND

Unless otherwise indicated herein, the materials described herein are not prior art to the claims in the present application and are not admitted to be prior art by inclusion in this section.

Parasitic resistance (e.g., equivalent series resistance (ESR)) and parasitic inductance (e.g., equivalent series inductance (ESL)) of capacitors are detrimental to high frequency performance of integrated circuits (ICs). Capacitance of a parallel plate capacitor may depend on an area that the capacitor occupies in a printed circuit board (PCB). However, space in the PCB may be a scarce resource since numerous circuit components may be integrated into the PCB. The parallel plate capacitor may usually appear on another side of the PCB connected with vias and/or traces that may incur extra inductance (e.g., ESL) and resistance (e.g., ESR) and that may lower a resonance frequency of the capacitor.

A ball grid array (BGA) IC may have dense packaging limitations for decoupling capacitors and other passive IC components. Even in outer row pads, providing bias to power traces in a BGA IC may be difficult with pitches that are less than or equal to 0.5 millimeter. In high frequency applications (e.g., 25 GHz or beyond), effective decoupling at BGA pads may be needed, e.g., using capacitors. However, decoupling at microwave and terahertz frequencies may be difficult due to parasitic resistance, parasitic inductance, and time to charge and/or discharge the capacitors.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to capacitors in printed circuit boards.

In an example embodiment, a capacitor in a printed circuit board is described. The capacitor may include a via of a via-in-pad type and a dielectric mixture filled in the via. The via may be disposed under an integrated circuit contact pad of the multilayer printed circuit board. The dielectric mixture may include a nanoparticle-sized dielectric powder mixed with an adhesive material.

In another example embodiment, the capacitor may include a coaxial via of a via-in-pad type that is disposed under an IC contact pad of the multilayer printed circuit board. The coaxial via may include an outer via wall, an inner via wall, and a dielectric mixture filled between the outer via wall and the inner via wall. The inner via wall may be coaxially aligned with the outer via wall. The dielectric mixture may include a nanoparticle-sized dielectric powder mixed with an adhesive material.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1B is a block diagram that illustrates a top view of the example printed circuit board of FIG. 1A;

DETAILED DESCRIPTION OF SOME EXAMPLE EMBODIMENTS

Figure 1A:
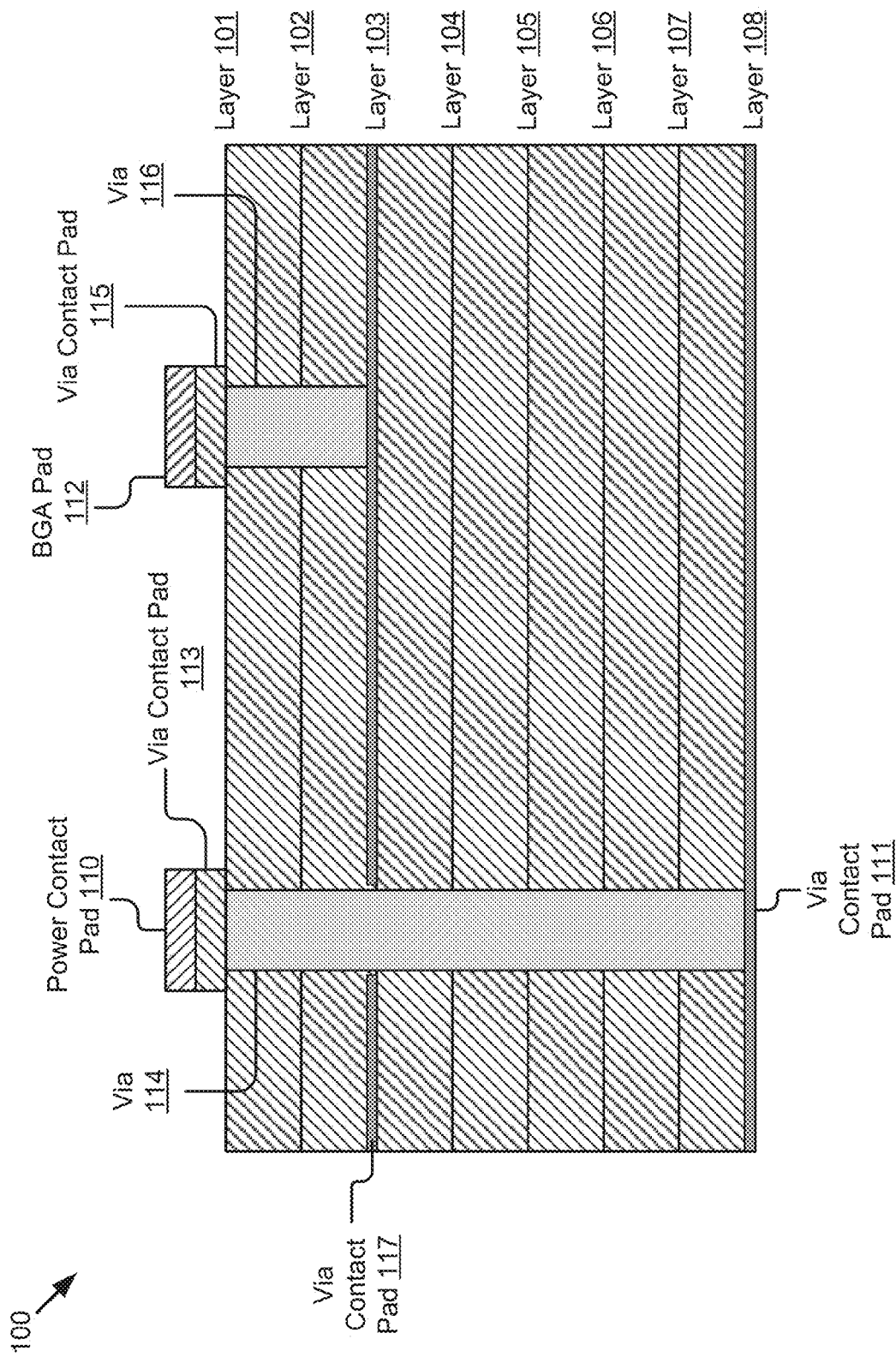
FIG. 1A is a block diagram that illustrates a cross-sectional view of a stack-up of an example printed circuit board.

Embodiments described herein generally relate to capacitors for printed circuit boards.

Some embodiments described herein may include via-in-pad capacitors that may be included in rigid or flex PCBs for high frequency applications. For example, the capacitors may be charged and/or discharged quickly and may be implemented in applications with a frequency of 25 GHz or beyond. In another example, the capacitors may be implemented in applications with a frequency of 56 GHz or beyond. The via-in-pad capacitors may be disposed directly under IC contact nodes, which may eliminate contact resistance, reduce ESR and ESL, and remove area factors compared to parallel plate capacitors and/or printed capacitors.

The via-in-pad capacitors may have a high self-resonance frequency compared to the parallel plate capacitors and/or printed capacitors.

In some embodiments, a via-in-pad capacitor may include a via disposed directly under an IC contact pad and a dielectric mixture filled in the via. Alternatively, a via-in-pad capacitor may include a coaxial via that includes an outer wall, an inner wall, and a dielectric mixture filled between the outer wall and the inner wall. An IC contact pad may include a power contact pad, a BGA pad, or another suitable type of IC contact pad.

The dielectric mixture may include a nanoparticle-sized dielectric powder mixed with an adhesive material. The dielectric powder may include a high dielectric constant (high K) low loss tangent dielectric material. Examples of the dielectric powder may include, but are not limited to, barium-strontium titanate ($BaSrTiO_3$), magnesium doped barium-strontium titanate, antimony doped barium-strontium titanate, titanium dioxide ($TiO_2$), tantalum pentoxide ($Ta_2O_5$), polycrystalline alumina powder and $TiO_2$, forsterite ($Mg_2SiO_4$), willemite ($Zn_2SiO_4$), $BaO$—$TiO_2$—$ZnO$, Zinc Niobates $MNb_2O_6$, $(Mg,Ca)TiO_3$, $ZnO$—$TiO_2$, $Mg(Sn(x)Ti(1-x))ZO_3$, and any other suitable dielectric powder material.

In some embodiments, the adhesive material may include polymers, and the dielectric mixture may include the dielectric powder mixed with the polymers. Alternatively, the adhesive material may include glass epoxy adhesive, and the dielectric mixture may include the dielectric powder mixed with the glass epoxy adhesive and glass frit. Alternatively, the adhesive material may include epoxy resins, and the dielectric mixture may include the dielectric powder mixed with the epoxy resins.

Capacitance of the via-in-pad capacitor may be related to a via length in the capacitor. For example, a first capacitor may have a first via that extends from a first layer to a third layer of a PCB. A second capacitor may have a second via that extends from the first layer to an eighth layer of the PCB. Since a first via length of the first capacitor is shorter than a second via length of the second capacitor, the first capacitor may have a capacitance value smaller than the second capacitor. In some embodiments, capacitance of a via-in-pad capacitor may be adjusted by changing a via length of the capacitor. Fifty ohms or other loads (e.g., 100 ohms, 25 ohms) may be obtained through design using lumped element designs and embedded via structures.

Additionally, capacitance of the via-in-pad capacitor may be related to temperature and an operating frequency of the PCB. For a particular capacitor, a lookup table may be constructed. The lookup table may list capacitance values of the capacitor in terms of different temperatures and different operating frequencies. A contact pad of the capacitor may have the same size as the IC contact pad and may have no stub. The via in the capacitor may have anti-pads that may isolate the via from PCB layers not connected to the via.

Reference will now be made to the drawings to describe various aspects of some example embodiments of the invention. The drawings are diagrammatic and schematic representations of such example embodiments, and are not limiting of the present invention, nor are they necessarily drawn to scale.

FIG. 1A is a block diagram illustrating a cross-sectional view of a stack-up of an example PCB 100, arranged in accordance with at least some embodiments described herein. The PCB 100 may include multiple copper-foil layers. For example, as illustrated in FIG. 1A, the PCB 100 may include eight layers 101-108. Each of the layers 101-108 may include a copper-foil layer. In some embodiments, a total number of layers in the PCB 100 may be 4, 6, 8, 10, or another suitable number. The PCB 100 may include a rigid board or a rigid-flex board.

Laminate may be placed between adjacent layers of the PCB 100. For example, pre-impregnated (PREPREG) composite fibers or other suitable laminate may be placed between the layer 101 and the layer 102, between the layer 103 and the layer 104, between the layer 105 and the layer 106, and between the layer 107 and the layer 108, respectively. Cores formed by Megtron 6 or FR-4 or other suitable material may be placed between the layer 102 and the layer 103, between the layer 104 and the layer 105, and between the layer 106 and the layer 107, respectively. In other embodiments, the arrangement of the laminate layers (e.g., PREPREG) and the cores between the layers 101-108 may be different than the foregoing.

The PCB 100 may include one or more vias embedded inside the PCB. The vias may include through-hole vias, blind vias, and buried vias. The PCB 100 may include one or more vias of a via-in-pad type. A via of a via-in-pad type may include a via disposed under an integrated circuit (IC) contact pad. For example, a via of a via-in-pad type may be disposed directly under an IC contact pad. An IC contact pad may include a power contact pad, a BGA pad, or any other suitable IC contact pad. For example, as illustrated in FIG. 1A, the PCB 100 includes a via 114 placed directly under a power contact pad 110. The via 114 may include a first via contact pad 113 and a second via contact pad 111. In some embodiments, the via contact pad 113 of the via 114 may have a first size that matches a second size of the power contact pad 110. For example, the first size of the via contact pad 113 may be the same as the second size of the power contact pad 110. Alternatively, a difference between the first size of the via contact pad 113 and the second size of the power contact pad 110 may be within ±15% of the first size. In some embodiments, the via contact pad 111 may be a ground contact or may connect the via 114 to a layer of the PCB. For example, the layer 108 may act as the via contact pad 111 (e.g., a ground contact) for the via 114. The PCB 100 may additionally include a via 116 placed directly under a BGA pad 112. The via 116 may include a first via contact pad 115 and a second via contact pad 117. In some embodiments, the via contact pad 115 of the via 116 may have a first size that matches a second size of the BGA contact pad 112. For example, the first size of the via contact pad 115 may be the same as the second size of the BGA contact pad 112. Alternatively, a difference between the first size of the via contact pad 115 and the second size of the BGA contact pad 112 may be within ±15% of the first size. In some embodiments, the via contact pad 117 may be a ground contact or may connect the via 116 to a layer of the PCB. For example, the layer 103 may act as a ground contact for the via 116. The vias 114 and 116 are each examples of a via of a via-in-pad type. The vias 114 and 116 may be un-plated vias. Although one power contact pad 110, one BGA pad 112, and two vias 114, 116 are illustrated in FIG. 1A, the PCB 100 may more generally include one or more power contact pads 110, one or more BGA pads 112, and one or more vias each implemented as a via-in-pad type. In some embodiments, a via of a via-in-pad type may allow access to an inner row of a BGA. A via of a via-in-pad type may include a contact pad with a first size that matches a second size of the IC contact pad. A via of a via-in-pad type may be designed using finite element analysis.

A via-in-pad capacitor may be formed by a via of a via-in-pad type and a dielectric mixture filled in the via. The via-in-pad capacitor may act as a decoupling capacitor, a filter capacitor, a bypass capacitor, or another suitable type of capacitor. A capacitance value of the via-in-pad capacitor may be related to a length of the via. In some embodiments, the capacitance value of the via-in-pad capacitor may be in a nanofarad (nF) range. Alternatively, the capacitance value of the via-in-pad capacitor may be in a microfarad (μF) or a picofarad (pF) range.

For example, a first via-in-pad capacitor may be formed by the via 114 disposed under the power contact pad 110 and filled with a dielectric mixture. The first via-in-pad capacitor may decouple a power signal supplied to the power contact pad 110 from a signal trace in the PCB 100. A second via-in-pad capacitor may be formed by the via 116 disposed under the BGA pad 112 and filled with the dielectric mixture. The second via-in-pad capacitor may decouple inner layer routings of power and/or signal traces, causing the inner layer routings to bypass the second via-in-pad capacitor. Additionally, the via 114 may have a first via length that extends from the layer 101 to the layer 108 and the via 116 may have a second via length that extends from the layer 101 to the layer 103. The layers 103 and 108 may be ground layers. Since the first via length of the via 114 is greater than the second via length of the via 116, the first via-in-pad capacitor may have a capacitance value greater than that of the second via-in-pad capacitor.

The dielectric mixture filled in the via-in-pad capacitors described herein may include ultrafine dielectric powder mixed with an adhesive material. For example, the ultrafine dielectric powder may be mixed with epoxy resins or polymers to form a dispensable paste that may be injected into a via hole. The injection of the dielectric mixture into a via hole may be similar to thermal epoxy deposition inside a via hole. In some embodiments, a percentage of the dielectric powder in the dielectric mixture may be greater than 80% or another suitable percentage number by volume, by weight, by concentration, or by any other suitable measuring mechanisms. The percentage of the dielectric powder in the dielectric mixture may be less than 100% since there may be adhesives, fillers, accelerants, curing agents, dispersants, and/or other materials in the dielectric mixture. The dielectric mixture may be temperature stable. For example, a thermal coefficient of expansion of the dielectric mixture may be less than 0.01 millimeter per Celsius degree.

The ultrafine dielectric powder may include a nanoparticle-sized dielectric powder in which individual particles of the powder are between about 1 and 100 nanometers in size. As used herein, the term "about" as applied to a value may indicate a range of ±15% of the stated value. The dielectric powder may include a high dielectric constant (high K) low loss tangent dielectric material. Examples of the dielectric powder may include, but are not limited to, barium-strontium titanate ($BaSrTiO_3$) with a decay of 300-3000, magnesium doped barium-strontium titanate, antimony doped barium-strontium titanate, titanium dioxide ($TiO_2$) with a decay of 50, tantalum pentoxide ($Ta_2O_5$) with a decay of 25, polycrystalline alumina powder and $TiO_2$, forsterite ($Mg_2SiO_4$), willemite ($Zn_2SiO_4$), BaO—$TiO_2$—ZnO, Zinc Niobates $MNb_2O_6$, $(Mg,Ca)TiO_3$, ZnO—$TiO_2$, $Mg(Sn(x)Ti(1-x))ZO_3$, and any other suitable dielectric powder material.

In some embodiments, the adhesive material may include polymers. Thus, the dielectric mixture may include the dielectric powder mixed with the polymers. Example polymers may include polyimides, benzocyclobutenes (BCB), or another suitable type of polymers. Alternatively, the adhesive material may include glass epoxy adhesive, and the dielectric mixture may include the dielectric powder mixed with the glass epoxy adhesive and glass frit. Alternatively, the adhesive material may include epoxy resins (e.g., DER 325, DEH324), and the dielectric mixture may include the dielectric powder mixed with the epoxy resins. The epoxy resins may include bonding agents (e.g., bisphenol-A or cyclo-aliphastic), curing agents (e.g., dicarboxylic acid anhydrides such as MHHPA), dispersing agents (e.g., phosphate esters), and/or catalysts (e.g., tertiary amines, imidazoles, ureas). The dispersing agents may prevent cluster formation of the dielectric powder in the epoxy resins.

The via in the via-in-pad capacitor may be constructed by laser drill or other suitable method and may be a plated through hole. The via may be filled with the dielectric mixture using screen printing, ink jet injection, micro syringe dispensers, and/or other suitable injection mechanisms. The via fill process may include imaging, hole plating, epoxy via fill, planarization, cap plating, and other suitable PCB fabrication processes.

Contact metallization may be performed on the via-in-pad capacitor. For example, the via-in-pad capacitor may be metallized using nickel-barrier and copper, which is compatible with existing PCB fabrication principles.

FIG. 1B is a block diagram that illustrates a top view 150 of the example PCB 100 of FIG. 1A, arranged in accordance with at least some embodiments described herein. The PCB may include a signal trace 152 (e.g., a power signal trace) connected to the power contact pad 110. The via 114 of FIG. 1A may be disposed directly below the power contact pad 110 and is not visible in FIG. 1B. The via-in-pad capacitor formed by the via 114 under the power contact pad 110 may decouple a power source connected to the power contact pad 110 from the signal trace 152. The via 116 of FIG. 1A may be disposed directly below the BGA pad 112 and is not visible in FIG. 1B. The via-in-pad capacitor formed by the via 116 under the BGA pad 112 may decouple inner layer routings of power and/or signal traces. A signal trace 154 of an inner layer is illustrated using dashed lines in FIG. 1B. The signal trace 154 may bypass the via-in-pad capacitor formed by the via 116.

Figure 2:
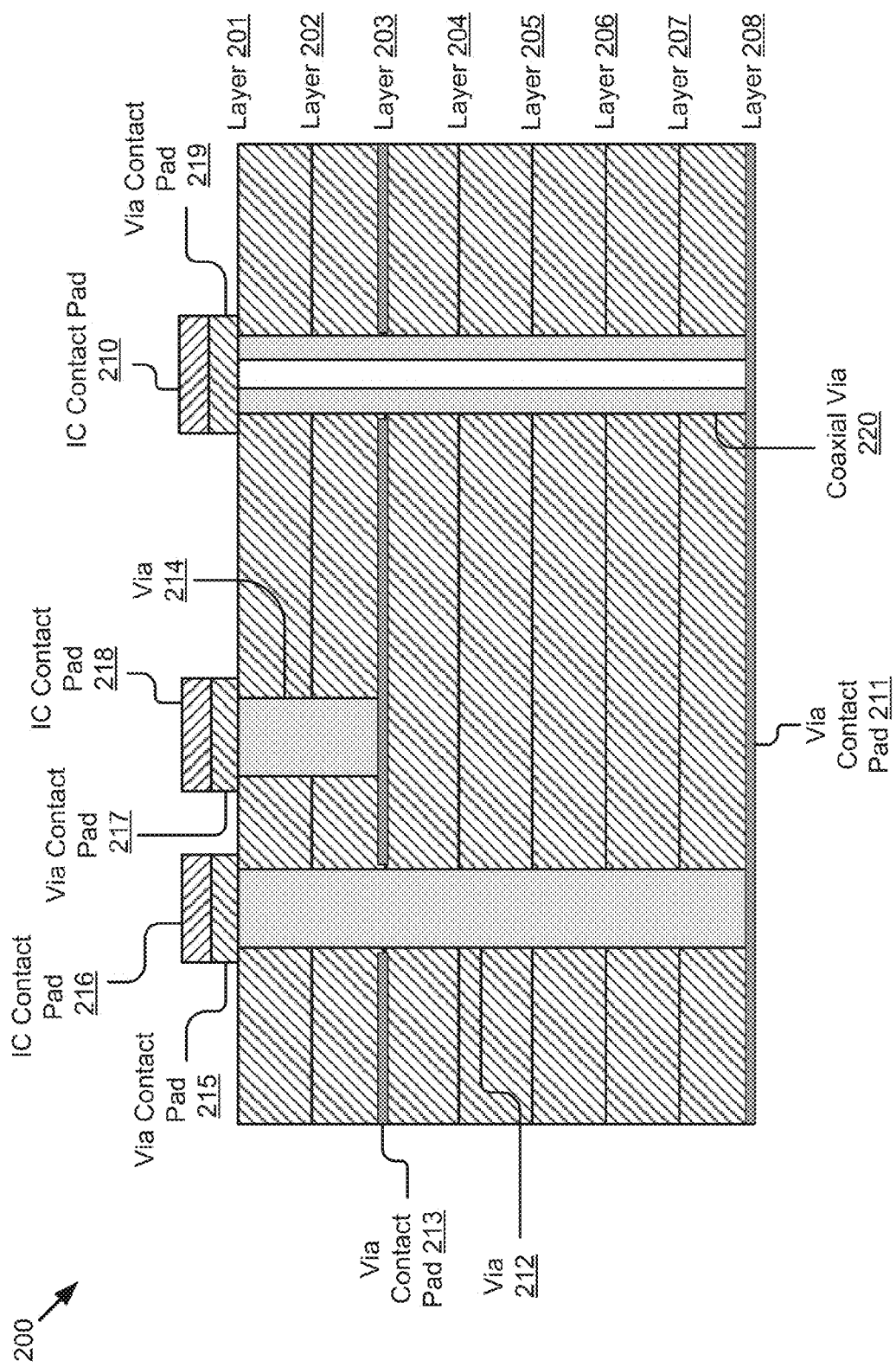
FIG. 2 is a block diagram that illustrates a cross-sectional view of a stack-up of another example printed circuit board.

FIG. 2 is a block diagram that illustrates a cross-sectional view of a stack-up of another example PCB 200, arranged in accordance with at least some embodiments described herein. The PCB 200 may include multiple copper-foil layers. For example, as illustrated in FIG. 2, the PCB 200 may include eight layers 201-208. Each of the layers 201-208 may include a copper-foil layer. In some embodiments, a total number of layers in the PCB 200 may be 4, 6, 8, 10, or another suitable number. The PCB 200 may include a rigid board or a rigid-flex board. Similar to the PCB 100 of FIG. 1A, laminate and/or cores may be placed between adjacent layers of the PCB 200.

The PCB 200 may include one or more vias embedded inside the PCB. The vias may include through-hole vias, blind vias, and buried vias. The PCB 200 may include one or more vias of a via-in-pad type. For example, the PCB 200 includes a via 212 placed under an IC contact pad 216, a via 214 placed under an IC contact pad 218, and a via 220 placed under an IC contact pad 210. The via 212 may include a first via contact pad 215 and a second via contact pad 211. The via 214 may include a first via contact pad 217 and a second via contact pad 213. The via 220 may include a first via contact pad 219 and the second via contact pad 211. In some embodiments, the layer 203 may act as the second via contact pad 213 (e.g., a ground contact for the via 214). The layer 208 may act as the second via contact pad 211 (e.g., a ground contact for the via 212 and the via 220).

The IC contact pads 216, 218, and 210 may include BGA pads, power contact pads, or other suitable types of IC contact pads. Although three IC contact pads 216, 218, 210 and three vias 212, 214, 220 are illustrated in FIG. 2, the PCB 200 may more generally include one or more IC contact pads and one or more vias.

The via 212 may be filled with a dielectric mixture to form a via-in-pad capacitor. Similarly, the via 214 may be filled with the dielectric mixture to form another via-in-pad capacitor.

In some embodiments, the via 220 may include a coaxial via as illustrated in FIG. 2. The coaxial via may function as an open-ended transmission line. The coaxial via may include an outer via wall, an inner via wall, and a dielectric mixture filled between the outer via wall and the inner via wall. The inner via wall may be coaxially aligned with the outer via wall. A via-in-pad capacitor may be formed by the coaxial via 220 filled with the dielectric mixture between the outer via wall and the inner via wall. In some embodiments, the outer via wall and the inner via wall may be copper via walls. The outer via wall may form an outer contact of the capacitor and the inner via wall may form an inner contact of the capacitor.

Figure 3A:
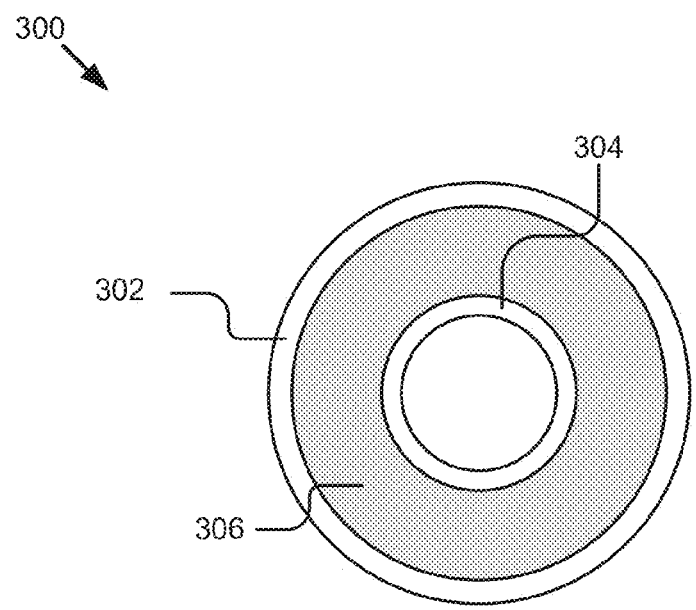
FIG. 3A is a block diagram that illustrates a top view of an example coaxial via.

FIG. 3A is a block diagram that illustrates a top view 300 of an example coaxial via, arranged in accordance with at least some embodiments described herein. The coaxial via may include an outer via wall 302, an inner via wall 304, and a dielectric mixture 306 filled between the outer via wall 302 and the inner via wall 304.

Figure 3B:
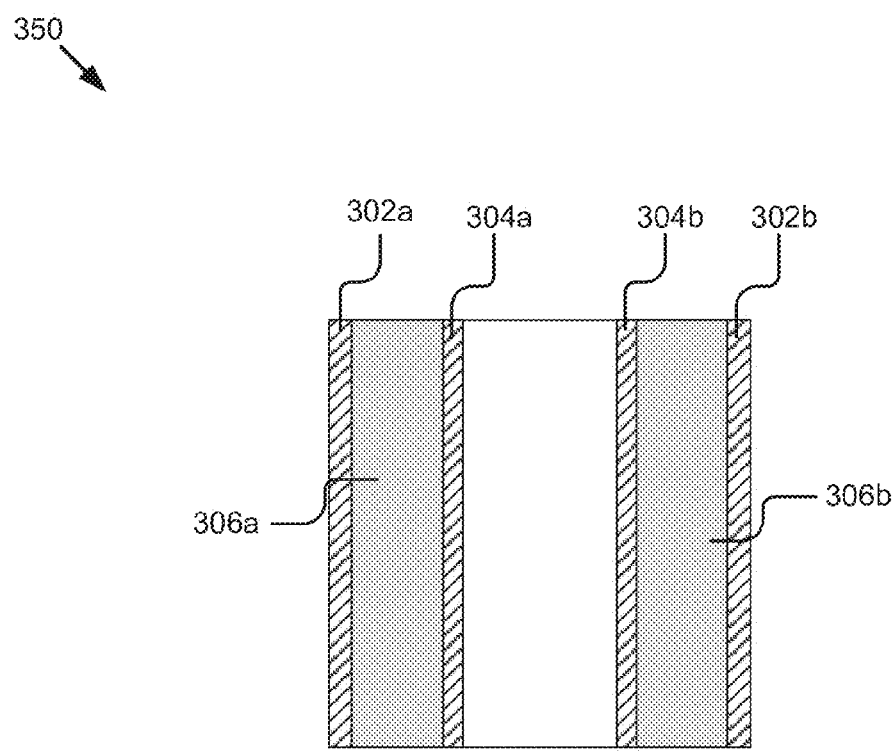
FIG. 3B is a block diagram that illustrates a cross-sectional view of the example coaxial via of FIG. 3A.

FIG. 3B is a block diagram that illustrates a cross-sectional view 350 of the example coaxial via of FIG. 3A, arranged in accordance with at least some embodiments described herein. The outer via wall 302 is illustrated using outer via wall sections 302a and 302b. The inner via wall 304 is illustrated using inner via wall sections 304a and 304b. The dielectric mixture 306 is illustrated using dielectric mixture sections 306a and 306b.

Figure 4:
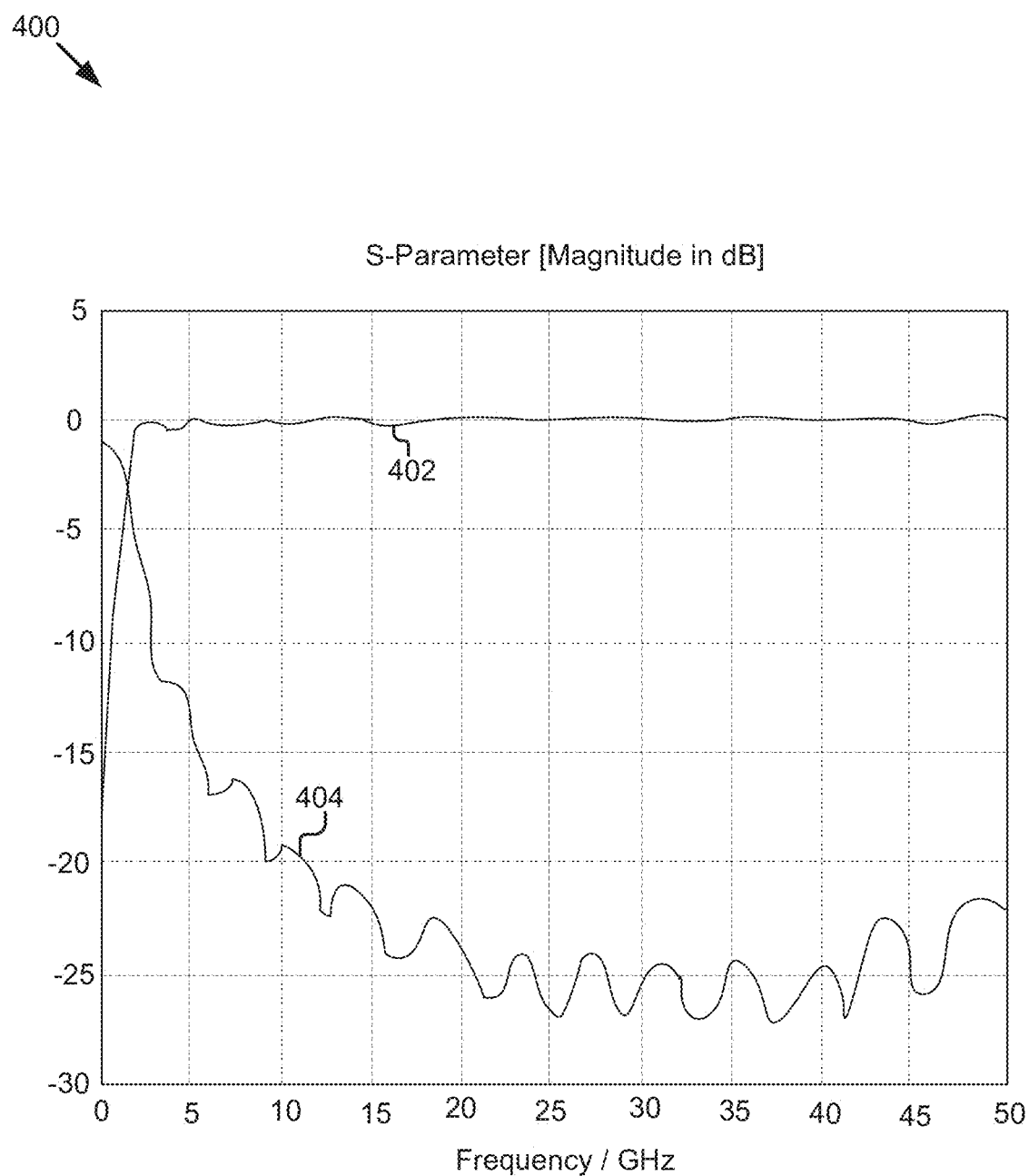
FIG. 4 includes a graphic representation that illustrates performance of an example via-in-pad capacitor.

FIG. 4 includes a graphic representation 400 that illustrates performance of an example via-in-pad capacitor, arranged in accordance with at least some embodiments described herein. A testing setup may include a transmission line with a via-in-pad capacitor in the path of the transmission line. The decoupling capability of the via-in-pad capacitor may be demonstrated by sending a test signal through the transmission line (used as a test wire herein) that is shunted by the via-in-pad capacitor to ground. A simulation result may show that high frequency signals along the transmission line may be drained or filtered by the via-in-pad capacitor and may not pass on the transmission line. In a real PCB design, there may not be a via-in-pad capacitor connected to a transmission line. However, there may be via-in-pad capacitors connected to power traces or power planes, and the via-in-pad capacitors may act as decoupling capacitors for the power traces or the power planes.

The via-in-pad capacitor may act as a filter capacitor, a bypass capacitor, or a decoupling capacitor. Decoupling effectiveness of the via-in-pad capacitor is illustrated in FIG. 4 using scattering parameters (S-parameter). A curve 402 may illustrate performance of an S-parameter $S_{1,1}$ as a function of frequencies. The S-parameter $S_{1,1}$ may represent an input reflection coefficient. A curve 404 may illustrate performance of an S-parameter $S_{2,1}$ as a function of frequencies. The S-parameter $S_{2,1}$ may represent a forward transmission coefficient. The curves 402 and 404 may indicate that presence of the via-in-pad capacitor may create a short circuit at high frequencies so that transmission of high frequency signals through the via-in-pad capacitor may be negligible (e.g., about 2.0% or less).

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A filter capacitor, a bypass capacitor, or a decoupling capacitor in a multilayer printed circuit board comprising:
   a via of a via-in-pad type that is disposed directly under an integrated circuit (IC) contact pad of the multilayer printed circuit board, wherein the via includes a via contact pad with a first size that matches a second size of the IC contact pad; and
   a dielectric mixture filled in the via, wherein:
      the dielectric mixture includes a nanoparticle-sized dielectric powder mixed with an adhesive material;
      individual dielectric particles of the nanoparticle-sized dielectric powder are between about 1 and 100 nanometers in size; and
      individual dielectric particles in the dielectric mixture do not exceed about 100 nanometers in size;
   wherein the filter capacitor, the bypass capacitor, or the decoupling capacitor is configured to filter or shunt signals at frequencies of 25 gigahertz (GHz) and higher.

2. The filter capacitor, the bypass capacitor, or the decoupling capacitor of claim 1, wherein the dielectric powder includes one of barium-strontium titanate, magnesium doped barium-strontium titanate, antimony doped barium-strontium titanate, titanium dioxide, and tantalum pentoxide.

3. A capacitor in a multilayer printed circuit board comprising:
   a via of a via-in-pad type that is disposed under an integrated circuit (IC) contact pad of the multilayer printed circuit board; and
   a dielectric mixture filled in the via of the via-in-pad type, wherein:

the dielectric mixture includes a nanoparticle-sized dielectric powder mixed with an adhesive material;

individual dielectric particles of the nanoparticle-sized dielectric powder are between about 1 and 100 nanometers in size;

a percentage of the nanoparticle-sized dielectric powder in the dielectric mixture is greater than 80% by volume; and the dielectric powder includes one of magnesium doped barium-strontium titanate, antimony doped barium-strontium titanate, and tantalum pentoxide;

wherein the capacitor is configured to filter or shunt signals at frequencies of 25 gigahertz (GHz) or higher; and wherein a forward transmission coefficient of the capacitor is less than about −20 decibels between signal frequencies of 12.5 GHz and 50 GHz.

4. The capacitor of claim 3, wherein the adhesive material includes polymers.

5. The capacitor of claim 3, wherein the adhesive material includes an epoxy resin with a bonding agent, a curing agent, a dispersing agent, and a catalyst.

6. The capacitor of claim 5, wherein the dispersing agent prevents cluster formation of the dielectric power in the epoxy resins.

7. The capacitor of claim 3, wherein the adhesive material includes glass epoxy adhesive and the dielectric mixture further includes glass frit.

8. The capacitor of claim 3, wherein a thermal coefficient of expansion of the dielectric mixture is less than 0.01 millimeter per Celsius degree.

9. The capacitor of claim 3, wherein the via includes a contact pad with a first size that matches a second size of the IC contact pad.

10. The capacitor of claim 3, wherein the IC contact pad includes one of a ball grid array (BGA) pad and a power contact pad.

11. The capacitor of claim 3, wherein the dielectric powder includes antimony doped barium-strontium titanate.

12. A capacitor in a multilayer printed circuit board comprising:

a coaxial via of a via-in-pad type that is disposed under an integrated circuit (IC) contact pad of the multilayer printed circuit board, wherein:

the coaxial via includes a via contact pad disposed under and in contact with the IC contact pad;

the via contact pad includes nickel-barrier and copper;

the coaxial via of the via-in-pad type further includes an outer via wall, an inner via wall, and a dielectric mixture filled between the outer via wall and the inner via wall;

the inner via wall is coaxially aligned with the outer via wall; and the dielectric mixture includes a nanoparticle-sized dielectric powder mixed with an adhesive material;

wherein the capacitor is configured to transmit about 2.0% or less of signals with frequencies between 12.5 gigahertz (GHz) and 50 GHz.

13. The capacitor of claim 12, wherein the adhesive material includes polymers.

14. The capacitor of claim 12, wherein the adhesive material includes epoxy resin with a bonding agent, a curing agent, a dispersing agent, and a catalyst.

15. The capacitor of claim 14, wherein the dispersing agent prevents cluster formation of the dielectric powder in the epoxy resins.

16. The capacitor of claim 12, wherein the adhesive material includes glass epoxy adhesive and the dielectric mixture further includes glass frit.

17. The capacitor of claim 12, wherein a percentage of the dielectric power in the dielectric mixture is greater than 80% by volume.

18. The capacitor of claim 12, wherein a thermal coefficient of expansion of the dielectric mixture is less than 0.01 millimeter per Celsius degree.

19. The capacitor of claim 12, wherein the coaxial via includes a contact pad with a first size that matches a second size of the IC contact pad.

20. The capacitor of claim 12, wherein the IC contact pad includes one of a ball grid array (BGA) pad and a power contact pad.

* * * * *